(12) United States Patent
Reed

(10) Patent No.: US 8,933,401 B1
(45) Date of Patent: Jan. 13, 2015

(54) SYSTEM AND METHOD FOR COMPRESSIVE SCANNING ELECTRON MICROSCOPY

(71) Applicant: Lawrence Livermore National Security, LLC, Livermore, CA (US)

(72) Inventor: Bryan W. Reed, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/063,319

(22) Filed: Oct. 25, 2013

(51) Int. Cl.
*G01N 23/00* (2006.01)
*G21K 7/00* (2006.01)
*G02B 26/10* (2006.01)
*H01J 37/28* (2006.01)

(52) U.S. Cl.
CPC ......... *H01J 37/28* (2013.01); *H01J 2237/2802* (2013.01)
USPC ...... 250/307; 250/306; 250/334; 250/559.06; 250/559.07; 378/46; 702/189; 382/232

(58) Field of Classification Search
USPC ........... 250/306–311, 330, 334, 492.1, 492.3, 250/559.01, 559.04, 559.05, 559.06, 5, 250/559.07; 378/5, 8, 43, 46, 87, 90, 210; 382/128, 132, 232, 233, 235, 325; 702/40, 127, 189
See application file for complete search history.

(56) References Cited

U.S. PATENT DOCUMENTS

| | | | |
|---|---|---|---|
| 4,939,365 A * | 7/1990 | Kobayashi et al. ........... | 250/311 |
| 6,763,322 B2 | 7/2004 | Potyrailo et al. | |
| 7,840,626 B1 | 11/2010 | Keenan | |
| 8,217,352 B2 * | 7/2012 | Reed ............................. | 250/311 |
| 8,223,052 B1 | 7/2012 | Kong et al. | |
| 8,232,523 B2 | 7/2012 | Boughorbel et al. | |
| 2003/0130823 A1 | 7/2003 | Potyrailo et al. | |
| 2007/0240242 A1 | 10/2007 | Modiano et al. | |
| 2011/0168888 A1 * | 7/2011 | Reed et al. ..................... | 250/307 |

(Continued)

FOREIGN PATENT DOCUMENTS

| | | |
|---|---|---|
| WO | 2004003671 A1 | 1/2004 |
| WO | 2007118215 A2 | 10/2007 |

(Continued)

OTHER PUBLICATIONS

Candes, Emmanuel J.; Romberg, Justin; and Tao, Terence. "Robust Uncertainty Principles: Exact Signal Reconstruction From Highly Incomplete Frequency Information," IEEE Trans. Inf. Theory, vol. 52, No. 2, pp. 489-509, Feb. 2006.

(Continued)

*Primary Examiner* — Bernard E Souw
(74) *Attorney, Agent, or Firm* — Harness & Dickey LLP

(57) ABSTRACT

A scanning transmission electron microscopy (STEM) system is disclosed. The system may make use of an electron beam scanning system configured to generate a plurality of electron beam scans over substantially an entire sample, with each scan varying in electron-illumination intensity over a course of the scan. A signal acquisition system may be used for obtaining at least one of an image, a diffraction pattern, or a spectrum from the scans, the image, diffraction pattern, or spectrum representing only information from at least one of a select subplurality or linear combination of all pixel locations comprising the image. A dataset may be produced from the information. A subsystem may be used for mathematically analyzing the dataset to predict actual information that would have been produced by each pixel location of the image.

22 Claims, 2 Drawing Sheets

(56) References Cited

U.S. PATENT DOCUMENTS

2011/0220791 A1* 9/2011 Reed .......................... 250/307
2011/0266440 A1 11/2011 Boughorbel et al.

FOREIGN PATENT DOCUMENTS

WO 2008085116 A1 7/2008
WO 2009026644 A1 3/2009

OTHER PUBLICATIONS

Candes, Emmanuel J. and Tao, Terence. "Near-Optimal Signal Recovery From Random Projections: Universal Encoding Strategies?," IEEE Trans. Inf. Theory, vol. 52, No. 12, pp. 5406-5425, Dec. 2006.
Duarte, Marco F. et al. "Single-Pixel Imaging via Compressive Sampling," IEEE Signal Processing Mag., pp. 83-91, Mar. 2008.
Binev, Peter et al. "Compressed Sensing and Electron Microscopy," Modeling Nanoscale Imaging in Electron Microscopy, Nanostructure Science and Technology, p. 73-126, 2012.
Stevens, A. et al. "The potential for Bayesian compressive sensing to significantly reduce electron dose in high-resolution STEM images," Journal of Microscopy (Oxford), PubMed—NCBI, 2013.
Bonnet, N. "Multivariate statistical methods for the analysis of microscope image series: applications in materials science," Journal of Microscopy—Oxford, vol. 190, pp. 2-18, Apr.-May 1998.
Bosman, M. et al. "Mapping chemical and bonding information using multivariate analysis of electron energy-loss spectrum images," Ultramicroscopy, vol. 106, No. 11-12, pp. 1024-1032, Oct.-Nov. 2006.
Cueva, P. et al. "Data Processing for Atomic Resolution Electron Energy Loss Spectroscopy," Microscopy and Microanalysis, vol. 18, No. 4, pp. 667-675, Aug. 2012.
Evans, N. D. et al. "Structure and Composition of Nanometer-Sized Nitrides in a Creep-Resistant Cast Austenitic Alloy," Metallurgical and Materials Transactions a-Physical Metallurgy and Materials Science, vol. 41A, No. 12, pp. 3032-3041, Dec. 2010.
Feitosa, R. Q. et al. "An Alternative Approach for Pattern Detection Applied to Materials Characterization," W S C G '2001, vols. 1 & II, Conference Proceedings, pp. 71-78, 2001.
Fu, X. Q. et al. "Preparation of a leaf-like CdS micro-/nanostructure and its enhanced gas-sensing properties for detecting volatile organic compounds," Journal of Materials Chemistry, vol. 22, No. 34, pp. 17782-17791, 2012.
Ganea, G. M. et al. "Experimental design and multivariate analysis for optimizing poly (D, L-lactide-co-glycolide) (PLGA) nanoparticle synthesis using molecular micelles," Journal of Nanoscience and Nanotechnology, vol. 8, No. 1, pp. 280-292, Jan. 2008.
Herzing, A. A. et al. "3D Nanoscale Characterization of Thin-Film Organic Photovoltaic Device Structures via Spectroscopic contrast in the TEM," Journal of Physical Chemistry C, vol. 114, No. 41, pp. 17501-17508, Oct. 2010.
Koeck, P. J. B. et al. "Unconventional immune double labelling by energy filtered transmission electron microscopy," Ultramicroscopy, vol. 62, No. 1-2, pp. 65-78, Jan. 1996.
Maigne, A. and Twesten, R. D. "Review of recent advances in spectrum imaging and its extension to reciprocal space," Journal of Electron Microscopy, vol. 58, No. 3, pp. 99-109, Jun. 2009.
Mishra, G. et al "Physical vs Photolithographic Patterning of Plasma Polymers: An Investigation by ToF-SSIMS and Multivariate Analysis," Langmuir, vol. 26, No. 5, pp. 3720-3730, Mar. 2010.
Parish, C. M. "Multivariate Statistics Applications in Scanning Transmission Electron Microscopy X-Ray Spectrum Imaging," Advances in Imaging and Electron Physics, vol. 168, pp. 249-295, 2011.
Parish, C. M. and Brewer, L. N. Key Parameters Affecting Quantitative Analysis of STEM-EDS Spectrum Images, Microscopy and Microanalysis, vol. 16, No. 3, pp. 259-272, Jun. 2010.
Parish, C. M. and Brewer, L. N. "Multivariate statistics applications in phase analysis of STEM-EDS spectrum images," Ultramicroscopy, vol. 110, No. 2, pp. 134-143, Jan. 2010.
Sarahan, M. C. et al. "Point defect characterization in HAADF-STEM images using multivariate statistical analysis," Ultramicroscopy, vol. 111, No. 3, pp. 251-257, Feb. 2011.
Shigesato, G. et al. "Boron segregation to austenite grain boundary in low alloy steel measured by aberration corrected STEM-EELS," Materials Science & Engineering A-Structural Materials Properties Microstructure and Processing, vol. 556, pp. 358-365, Oct. 2012.
Tang, B. et al. "Two-Dimensional Correlation Localized Surface Plasmon Resonance Spectroscopy for Analysis of the Interaction between Metal Nanoparticles and Bovine Serum Albumin," Journal of Physical Chemistry C, vol. 114, No. 49, pp. 20990-20996, Dec. 2010.
Titchmarsh, J. M. "X-ray Spectrum Processing and Multivariate Analysis," Mikrochimic Acta, vol. 15, pp. 37-47, 1998.
Titchmarsh, J. M., "EDX spectrum modelling and multivariate analysis of sub-nanometer segregation," Micron, vol. 30, No. 2, pp. 159-171, Apr. 1999.
Wang, I.C. et al. Polymorph Transformation in Paracetamol Monitored by In-line NIR Spectroscopy During a Cooling Crystallization Process, AAPS PharmSciTech, vol. 12, No. 2, pp. 764-770, Jun. 2011.
Witte, C. et al. "Extracting physically interpretable data from electron energy-loss spectra," Ultramicroscopy, vol. 110, No. 11, pp. 1390-1396, Oct. 2010.
Yaguchi, T. et al. Observation of three-dimensional elemental distributions of a Si device using a 360 degree-tilt FIB and the cold field-emission STEM system, Ultramicroscopy, vol. 108, No. 12, pp. 1603-1615, Nov. 2008.
Yakovlev, S. and Libera, M. "Dose-limited spectroscopic imaging of soft materials by low-loss EELS in the scanning transmission electron microscope," Micron, vol. 39, No. 6, pp. 734-740, Aug. 2008.
Yamazaki, T. et al. "Analysis of EEL spectrum of low-loss region using the C-s-corrected STEM-EELS method and multivariate analysis," Ultramicroscopy, vol. 111, No. 5, pp. 303-308, Apr. 2011.
Yao, H. et al. "Chemometric and Microscopic Analyses for the Size Growth of Monolayer-Protected Gold Nanoparticles during Their superlattice formation," Langmuir, vol. 23, No. 26, pp. 13151-13157, 2007.
Yedra, L. et al. "EEL spectroscopic tomography: Towards a new dimension in nanomaterials analysis," Ultramicroscopy, vol. 122, pp. 12-18, Nov. 2012.
Yoshida, T. et al. "Depth-resolved EELS and chemical state mapping of N+-implanted TiO2 photocatalyst," Materials Transactions, vol. 48, No. 10, pp. 2580-2584, Oct. 2007.
Savu, Daniel. "A Basic Concept in Compressive Sensing Applied to a STEM Image Reconstruction Problem," http://imi.cas.sc.edu/IMI/workshop-feb2011/a-basic-concept-in-compressive-sensing-applied-to-a, May 21, 2014, 1 p.

* cited by examiner

US 8,933,401 B1

SYSTEM AND METHOD FOR COMPRESSIVE SCANNING ELECTRON MICROSCOPY

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to scanning transmission electron microscopy (STEM), and more particularly to a system and method for performing STEM that also makes use of compressive sensing with rapid modulation of the beam intensity or scan speed or scan path during the scan to make more effective use of the acquisition time and the electron beam dose delivered to a sample.

BACKGROUND

The statements in this section merely provide background information related to the present disclosure and may not constitute prior art.

Many applications in research and industry benefit from high-resolution structural and spectral information obtained with scanning transmission electron microscopy (STEM) diffraction, high-angle annular dark-field STEM (HAADF-STEM), STEM electron energy loss spectrum (STEM-EELS), and STEM energy-dispersive x-ray spectroscopy (STEM-EDX). A typical operating sequence is to set up the instrument to acquire the signal of interest, place a finely focused electron probe on one spot on the specimen, acquire the signal (e.g. a diffraction pattern, a current reading from an HAADF detector, or a loss spectrum), and then move the probe and repeat the above operations. While automated systems allow this all to happen fairly quickly in a well-defined, regular 2D array, the information return is far from optimal. In the case of STEM diffraction and STEM-EELS, each acquisition may take a significant fraction of a second or even multiple seconds, so that the entire scan of the sample may take hours. Yet much of the information so obtained is in some sense redundant. Also, HAADF-STEM scans may be performed much more quickly than STEM-diffraction scans but return vastly less information; given a STEM-diffraction data set, one can reconstruct what any conventional STEM image (HAADF, conventional bright-field, annular bright-field, split-detector, etc.) would have produced while also using information from Bragg diffraction to identify crystal phases and orientations. Thus a technique that provides data return similar to STEM-diffraction with total exposure times comparable to HAADF-STEM would represent a substantial improvement relative to both techniques.

It is also well known, especially for STEM-EELS, that there are representations of the data for which the data set is "sparse." What this means is that each spectrum or diffraction pattern can be represented to high precision as a combination of a relatively small number of principal or independent components, and that many of the spectra and diffraction patterns will look very similar to one another. From an information-theoretical perspective, this means much of the signal acquired in the scan is redundant and is not actually providing new, relevant, independent information about the sample. For HAADF-STEM, much faster scans are possible but only a small amount of information is retrieved from each electron; more specifically, either the electron hits the HAADF detector or it does not. This is because the very existence of HAADF represents a practical compromise. It is in essence a STEM diffraction system operating with a camera that is very fast but that only has a single pixel.

Past efforts to improve STEM data throughput have focused on improving the brightness, stability and aberrations in the probe-forming system as well as the signal-to-noise ratio in the detectors. Now that the signal-to-noise ratios are reaching the level of detecting single electrons, and the probe current densities are high enough that beam damage to the sample is very often the resolution limitation, these strategies are running out of room for improvement. Accordingly, new systems and methodologies are needed to make more efficient use of the acquisition time and the electron beam dose delivered to a sample when performing STEM diffraction or STEM-EELS.

SUMMARY

In one aspect the present disclosure relates to a scanning transmission electron microscopy (STEM) system. The system may make use of an electron beam scanning system configured to generate a plurality of electron beam scans over substantially an entire sample, with each scan varying in electron-illumination intensity over a course of the scan. A signal acquisition system may be used for obtaining an image from the scans, the image representing information from only a select subplurality (or, more generally, an arbitrary linear combination) of all available pixels comprising the image. A dataset may be produced from the information. A subsystem may be used for mathematically analyzing the dataset to reconstruct information that would have been produced by each pixel in a conventional STEM acquisition.

In another aspect the present disclosure relates to a scanning transmission electron microscopy (STEM) system. The system may comprise an electron beam scanning system for generating a sequence of electron beam scans directed at a sample. Each electron beam scan may have a spatially varying electron-illumination intensity delivered to a region of the sample over a course of the scan that creates a mask. This pattern of illumination intensity may be generated by modulating the electron beam current, by modulating the scan speed, by scanning in an arbitrary pattern as opposed to the standard raster scan normally used in STEM, or by any combination of these methods. A signal acquisition subsystem may be used for obtaining an image, a diffraction pattern, or a spectrum from each one of the electron beams scans after each scan is influenced by the sample, and may produce a data set from at least one of the full collection of images, diffraction patterns, or spectra generated by the collection of masks. The data set may represent information at preselected subpluralities or linear combinations of all available pixels of the image. A computer may be used which is configured to mathematically analyze the data set to predict actual information that would have been obtained from each individual pixel in the image had the STEM scan been performed in the conventional raster pattern. The mathematical techniques of compressive sensing generally allow this reconstruction even in the case that the total number of masks is a small fraction of the number of pixels, and the total exposure time or electron beam dose is a small fraction of what would have been used in a conventional STEM scan of the same type (such as STEM-diffraction, STEM-EELS, or STEM-EDX).

In still another aspect the present disclosure relates to a method for performing scanning transmission electron microscopy (STEM). The method may comprise performing a plurality of electron beam scans over substantially an entire sample, with each scan varying in electron-illumination intensity over a course of the scan. An image may be obtained from the scans which includes information pertaining to only a select subplurality or linear combination of all available pixels that make up the image. A dataset may be produced from the information during the scans. The dataset may be mathematically analyzed to predict actual information that would have been produced by each pixel of the image had the STEM scan been performed in the conventional raster pattern.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way. In the drawings.

DETAILED DESCRIPTION

Figure 1:
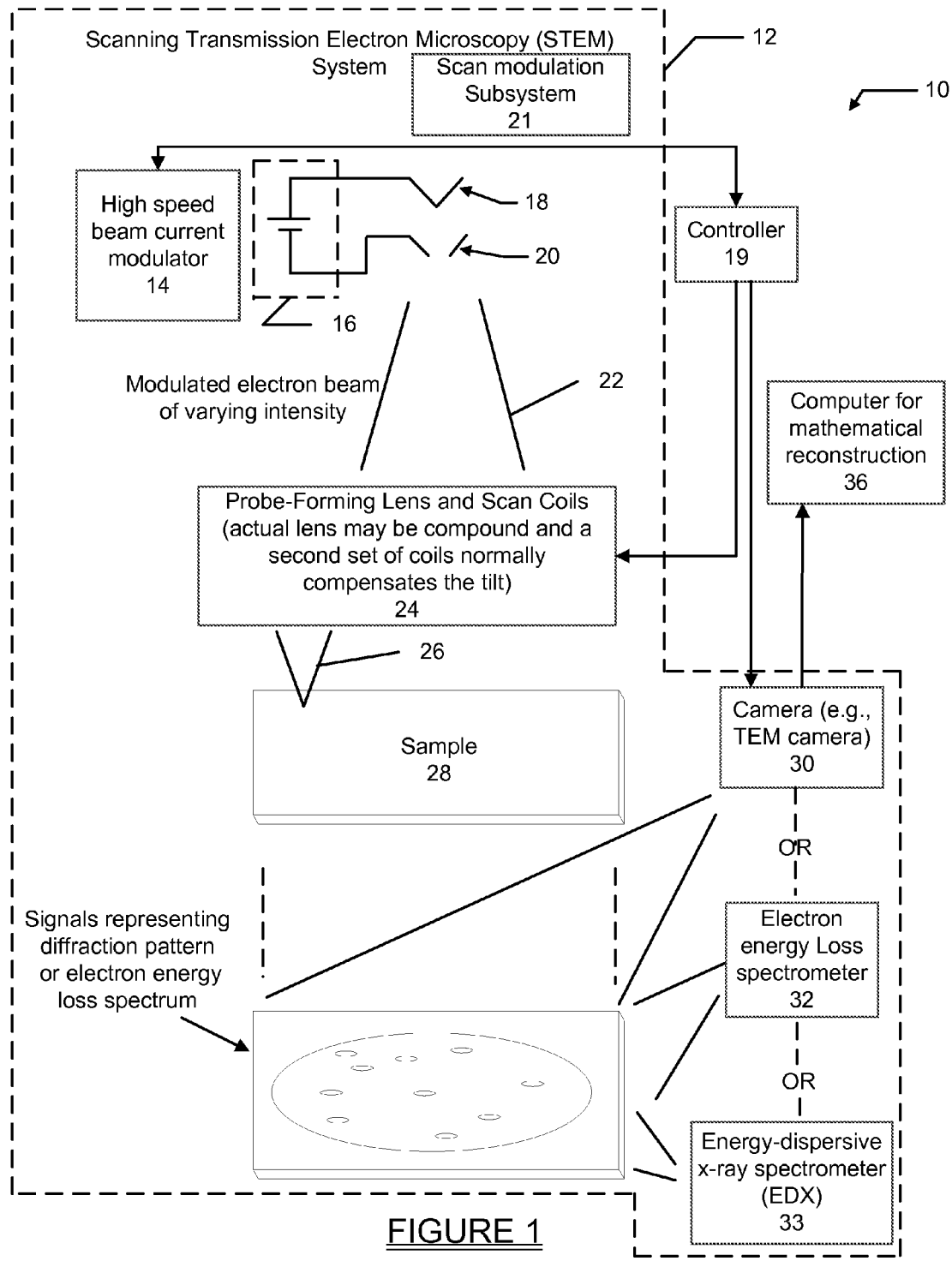
FIG. 1 is a high level block diagram of one embodiment of a scanning transmission electron microscopy (STEM) system in accordance with the present disclosure that makes use of compressive sensing to reduce the data set and significantly improve throughput in STEM diffraction, STEM-EELS, and STEM-EDX.

The following description is merely exemplary in nature and is not intended to limit the present disclosure, application, or uses. It should be understood that throughout the drawings, corresponding reference numerals indicate like or corresponding parts and features.

The present disclosure presents a solution to the above-described limitations that is similar in mathematical principle to the single-pixel camera, which uses a photodiode and a micromirror array to take optical images, but is completely different in technical detail in that the present solution uses an electron microscope and a temporally modulated beam synchronized with a raster scan, or a variable-speed scan, or a scan in an arbitrary non-raster pattern, or some combination of these modulation techniques to produce an arbitrary intensity pattern at the sample. Also, of significant importance and advantage, masking may be done in the illumination instead of in the detection, which minimizes any possible radiation damage to the sample.

Referring to FIG. 1, a sensing system 10 is shown in accordance with one aspect of the present disclosure. The system 10 makes use of compressive sensing to significantly improve information throughput in STEM-EELS and STEM diffraction. The system 10, in one embodiment, may form a scanning transmission electron microscopy (STEM) system 12 that makes use of a temporally modulated electron beam current and mathematical techniques for post-measurement reconstruction. A fast beam-current modulator 14 of the STEM system 12 modulates the output of a power supply 16 controlling the extraction or gate voltage applied to an electron gun 18. The fast beam-current modulator 14 may be controlled by a controller 19.

An extraction electrode 20 receives the output from the modulated power supply to produce a modulated electron beam 22. The modulated electron beam 22 is fed into a subsystem 24 which includes a probe-forming lens and scan coils, and which focuses and controls movement of the electron beam 22. The probe-forming lens system and scan coils are standard components in a STEM. The voltage or current of the power supply 16 may be modulated by the controller 19 in synchrony with the voltage or current applied to the scan coils of the subsystem 24. This produces an electron beam 26 having an arbitrarily varying intensity as it is raster scanned rapidly back and forth over a sample 28 to irradiate the sample. The arbitrarily varying intensity produces an arbitrarily varying pattern of dimly and brightly electron-illuminated regions on the sample 28, which may be termed a "mask".

The system 10 may further include a signal acquisition subsystem, in one example a camera, for example a standard TEM camera 30, for acquiring a diffraction pattern produced by the sample 28. Alternatively, the signal acquisition subsystem may comprise an electron energy loss (EEL) (spectrometer 32 which is used to evaluate an electron energy loss spectrum (EELS) resulting from the beam 26 irradiating and passing through the sample 28. One suitable EELS acquisition system would be a Gatan Imaging Filter (GIF) available from Gatan, Inc. of Pleasanton, Calif. Alternatively or simultaneously, the signal acquisition subsystem may comprise an EDX acquisition system 33 which is used to acquire an energy-dispersive x-ray spectrum resulting from beam 26 irradiating and passing through the sample 28. The TEM camera 30, the EEL spectrometer 32 or the EDX acquisition subsystem 33 (hereinafter the "EDX spectrometer") may be controlled by the controller 19 so that operation is synchronized with the scanning of the electron beam 26.

The TEM camera 30, the EEL spectrometer 32 or the EDX spectrometer 33 may provide an output to a computer 36 configured to perform mathematical reconstruction of compressively sensed data. The output is represented by a dataset that includes information (i.e., relating either to diffraction pattern, electron energy loss spectrum or energy dispersive x-ray spectrum) obtained from all the scans of the sample 28.

During an initial scan using a first mask, the TEM camera 30 may be used to obtain the diffraction pattern, or the EEL spectrometer 32 may be used to obtain the loss spectrum, and/or the EDX spectrometer 33 may be used to obtain the x-ray emission spectrum. Then another scan using a different mask is executed and another diffraction pattern or spectrum is acquired. By the term "different mask", it is meant that a different arbitrary illumination pattern is generated using the STEM system 12 and the subsystem 24. This procedure is repeated, with an acquisition completed using any of the TEM camera 30, the EEL spectrometer 32 and/or the EDX spectrometer 33, for each one of a desired plurality of known (but arbitrary) masks. By "known" it is meant that the arbitrary mask produced will be known, typically but not necessarily in advance. By "arbitrary" it is meant that the variation in illumination intensity as each scan is performed will be freely definable as dictated by the mathematical theory of compressive sensing. A mask will typically, but not necessarily, have no discernible or regular pattern, but will appear to simply be a randomly changing intensity. The information acquired from the set of such scans may be termed a "data set".

The dataset may be analyzed using well known mathematical compressive sensing techniques. Mathematical compressive sensing techniques enable a reconstruction of a high-quality estimate of what the detector would have recorded from every single individual pixel making up the image, had a conventional raster scan of the entire sample 28 been performed. For STEM diffraction, typically this would be an estimate of the entire 2D diffraction pattern from every point in the 2D scanned image or, in other words, a 4D data set. For STEM-EELS or STEM-EDX, the result would be an estimate of the 1D spectrum at every point in the scanned image, which produces a 3D data set commonly called a "spectrum-image" or a "data cube." These are expected to be the most popular operating modes, but of course other modes are possible. Such other operating modes might incorporate, for example, a tomographic tilting holder, angular-resolved EELS, or time-resolved TEM to increase the dimensionality of the data set still further.

It will be appreciated that compressive sensing is somewhat counterintuitive. Compressive sensing essentially takes advantage of the fact that real-world data sets are highly patterned and are very far from being purely random. They are almost always in some sense mathematically "sparse" or at least approximately sparse in a way that is amenable to data compression. This means that there is a mathematical representation in which the data set (which could be an image, a set of images perhaps in a video time-series, a set of spectra, etc.) can be represented by a set of coefficients, the great majority of which are either zero or are close enough to zero that neglecting or approximating them has little practical effect on the quality of the data. This fact is familiar to those who work with MPEG and JPEG compression, in which it is well established that often 80-90% of the information (in terms of raw byte counts) in a digital media file may be eliminated with little or no perceptible degradation in quality. These techniques rely on mathematical transformations such as discrete cosine transformations which, in the case of image compression, essentially amount to the application of a series of masks to an image, and recording the degree of overlap (mathematically, the inner product) between the image and each mask. In the limit where the number of masks equals the number of pixels, the image can be reconstructed exactly. But very often only a fraction of the masks (perhaps 10-20%) encode the vast majority of the relevant, non-noise information in the image and the rest can be discarded or approximated with little consequence. The system 10 of the present disclosure applies compressive sensing to the actual acquisition of an image rather than the post-acquisition analysis. This allows information from a selected subplurality or linear combination of all available pixel locations of the image to be obtained, rather than information for each and every pixel location of the image. This can significantly reduce the time required to acquire the dataset as compared to a conventional STEM system which needs to acquire information for each and every pixel of the image. This has three advantages: reducing the acquisition time to extract a given set of information (thus improving data throughput); reducing the electron beam exposure to extract a given set of information (thus reducing radiation damage and allowing more radiation-sensitive materials to be measured than is possible with conventional methods); and increasing the amount of information acquired for a given acquisition time and/or dose (e.g., acquiring a STEM-diffraction data set with a total exposure comparable to that required for a conventional HAADF-STEM acquisition).

Further to FIG. 1, during operation of the system 10, if the TEM camera 30 is being used, the TEM camera records a superposition of diffraction patterns corresponding to the set of sample positions selected by the mask. The set of sample positions represents a preselected subplurality or linear combination of all available pixel locations making up the image that the TEM camera 30 is able to produce. If the EEL spectrometer 32 is being used, then an energy-loss spectrum is obtained which corresponds to the set of sample positions selected by the mask (i.e., the preselected subplurality or linear combination of all available pixel locations making up the image). This is then repeated with an optimal or near-optimal set of masks. For example, given the typical 80% to 90% compressibility of real-world images reported in present day compressive sensing literature, it is not unreasonable to expect a one-megapixel STEM-diffraction dataset or spectrum-image to be reconstructed with only 100,000 or 200,000 masks, thus representing a five- to ten-fold reduction in acquisition time and/or total electron beam exposure.

It will also be appreciated that present day literature on compressive sensing has established that random white noise is very nearly optimal for many applications. The mathematical challenge associated with optimal mask design is well covered in the present day literature on compressive sensing. If the data set were purely random, with (for example, in STEM-EELS) a completely different spectrum coming from each point in the image, then this acquisition method would have no advantages over conventional STEM. But in real world applications, the spectrum from one location on a given sample is very likely to look very much like the spectrum from a nearby location on the same sample, and the space of physically relevant variation in the spectra produced by a given sample is of far lower dimensionality than the number of independent channels in the spectrometer. This is well established in present day EELS data analysis literature. The experience of the inventor of the present disclosure with principal-component analysis of diffraction patterns suggests that the same is true of STEM diffraction.

The system and method described in the present disclosure differ substantially from all published proposed systems and methods for applying compressed sensing to electron microscopy (for example, H. S. Anderson et al., "Sparse Imaging for Electron Microscopy," Proc. SPIE 86570C, February 2013 (henceforth "Anderson et al."); P. Binev et al., "Compressed Sensing and Electron Microscopy," in "Modeling Nanoscale Imaging in Electron Microscopy," T. Vogt, W. Dahmen, and P. Binev Eds., Springer, 2012 (henceforth "Binev et al.")). Anderson et al. use a modulated scan in a scanning electron microscope (SEM) (which operates using some of the same physical principles as a scanning transmission electron microscope) to create an SEM image that is acquired in an entirely conventional way except that the beam dwells for a significant time only at a selected subplurarity of image locations. As in conventional SEM, a single detector records a signal current from each individual location. Thus this method is not truly within the paradigm of compressive sensing as discussed by Binev et al., since the distinction among different spatial positions is still determined in exactly the same way as in conventional SEM, i.e., by synchronizing a detector signal to a scanning system. In fact this appears to be just an example of the use of readily available mathematical techniques to reconstruct undersampled images that are acquired in an essentially conventional way. In contrast, Binev et al. demonstrate a reasonably full understanding of the compressive sensing paradigm but spend relatively little time discussing the actual mechanics and instrumentation of the implementation. Perhaps because of this, Binev et al. do not touch on one fundamental insight that distinguishes the system and method discussed in the present disclosure from all published literature: That, once one has used compressive sensing techniques to achieve spatial resolution through unconventional means, then one is free to use a large (but more typically a massive) parallel detection system operating at relatively low speed (since it needs to make only one acquisition per scan rather than one acquisition per pixel) to dramatically increase the information throughput relative to what can be achieved with a single-channel detector. All of the analysis in the publication by Binev et al. essentially appears to assume that signal collection is still done in a conventional way, for example with a standard single-channel HAADF-STEM detector. In contrast, the system and method proposed in the present disclosure apply compressive sensing not to HAADF-STEM (which uses a single-channel detector) but to higher-dimensional acquisition modes including but not limited to STEM-EDX, STEM-EELS, and STEM-diffraction which use detectors with, in effect, hundreds, thousands, or even millions of channels. Thus, in effect, the system and method of the present disclosure is able to use the parallelism in the detector to perform hundreds, thousands, or millions of compressively sensed STEM acquisitions simultaneously. This is a very significant and very fundamental distinction from all previously disclosed or published detection systems.

The fast beam-current modulator subsystem 14 may be implemented via a number of established techniques. For example, rapid modulation of electron gun 18 current may be accomplished through modulation of the voltages on electrostatic elements such as on a field-emission-gun extraction electrode 20 or on one or more of the electrodes in a monochromator. Modern arbitrary waveform generators and broadband high-voltage amplifiers can provide the needed electrical signals with modulation frequencies approaching 1 GHz and can easily be programmed to accept a timing trigger from the system 10 that controls the electron-beam scan. This voltage signal should be applied to electrodes that are preferably at least about 60 kV or more away from ground potential, and this is achieved with relatively straightforward modification of standard TEM components. The electron gun could also be based on a photocathode driven by an arbitrary-waveform laser.

Another method of varying the intensity of illumination may involve momentarily changing the speed of each raster scan a plurality of times, again in a predefined pattern, using a scan modulation subsystem 21 (FIG. 1), over the course of an entire scan. More generally, an arbitrary scan pattern with varying speeds and directions may be defined and applied to the scan coils using a high-speed electronic sequencing system, akin to a vector graphics display. Such a scan-modulation subsystem 21 may be operated on its own or in combination with the electron-beam-current modulation to produce the desired arbitrary intensity pattern at the sample. Still further, another potential method of varying the intensity of the illumination may involve using an electron gun with a large array of independently gated emitters.

Figure 2:
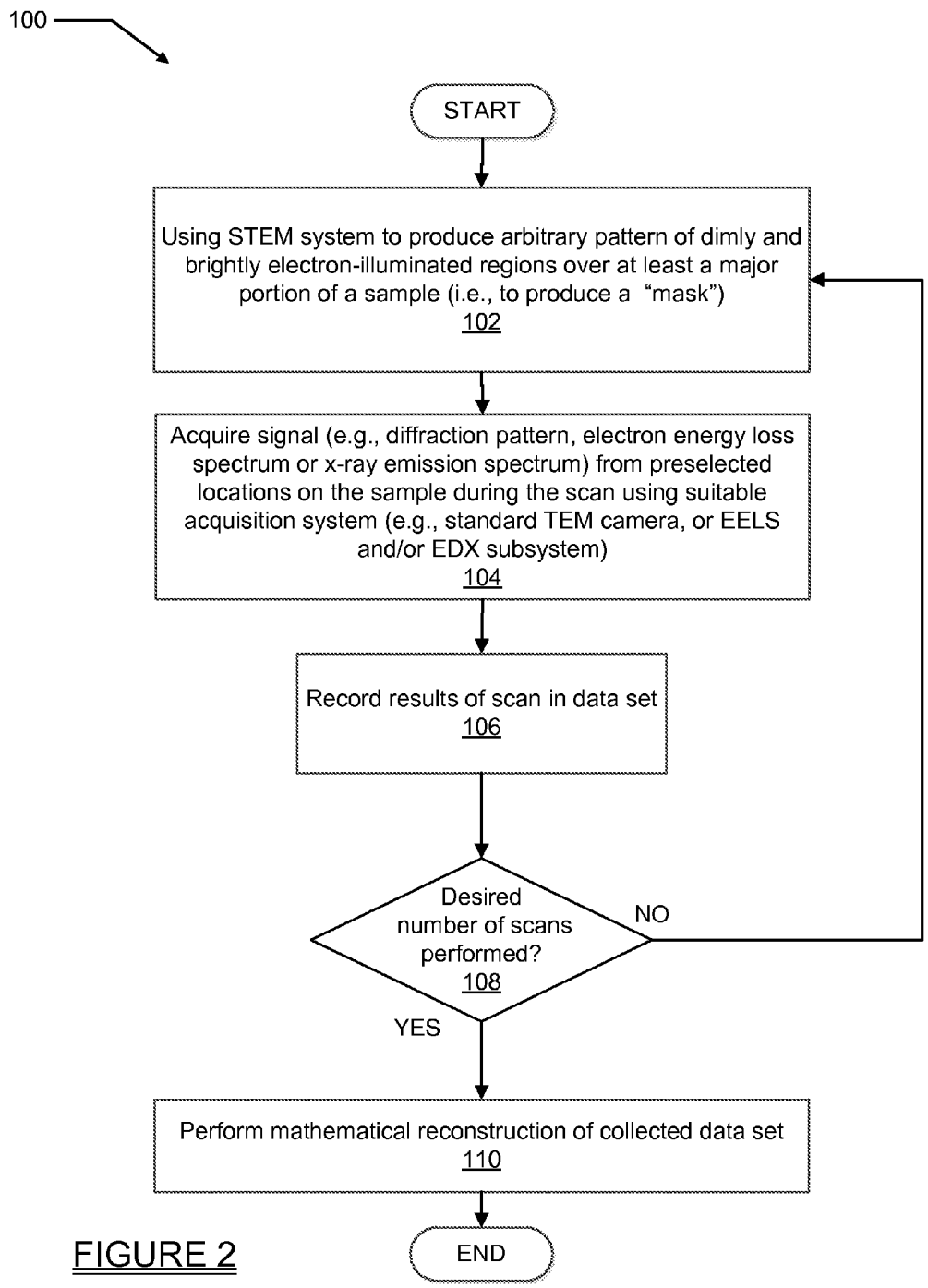
FIG. 2 is a high level flow chart of operations that may be performed using the system shown in FIG. 1.

Referring to FIG. 2 a high level flowchart 100 is presented of various operations that may be performed using the STEM system 10 of FIG. 1. At operation 102 the STEM system 12 may be used to produce an arbitrary pattern of dimly and brightly electron-illuminated regions over at least a major portion of the sample 28, and more preferably over the entire sample. At operation 104 the signal generated (e.g., diffraction pattern, EELS, or EDX) at preselected locations on the sample is collected using either the TEM camera 30 or the EEL spectrometer 32 or the EDX detector. At operation 106 the results of the scan are recorded in a data set. At operation 108 a check is made if the desired number of scans has been performed. If not, then operations 102-108 are repeated. If the desired number of scans has been completed, then the computer 36 is used to perform the reconstruction on the data set, as indicated at operation 110.

With the system 10, for an N-pixel image, typically only 0.1N to 0.2N acquisitions will typically need to be obtained using compressive sensing as compared to N for conventional STEM. The raster scanning may also be performed much more rapidly than what would be possible with a conventional STEM system, since it is only necessary to make one acquisition per scan instead of one acquisition per pixel. Very often it is the detector and not the scanning system that limits the scan speed in a conventional STEM, even with standard electromagnetic scanning coils; electrostatic scanning plates (as are used, for example, in streak cameras) can be much faster, thus potentially allowing an entire scan to be completed in a fraction of a millisecond. For example, in HAADF-STEM, the phosphor decay time limits the dwell time to, optimistically, no less than perhaps one microsecond per pixel, with 10-100 microseconds per pixel being more typical values. In STEM-diffraction, the camera readout normally takes milliseconds or even seconds per pixel, so that large high-resolution scans can take many hours. STEM-EELS and STEM-EDX similarly will have typical dwell times of multiple milliseconds to seconds. Applying the system 10 to the case of HAADF-STEM should allow essentially the same image to be acquired with five to ten times less total electron dose to the sample and, depending on the characteristics of the electronic control system, potentially lower total acquisition time as well. Or the system 10 could be used to acquire a STEM-diffraction data set with a comparable total electron dose to what is conventionally used in an HAADF-STEM acquisition, thus obtaining much more information per electron. In general, the compressive-sensing approach makes much better use of the information provided by each electron, allowing the user to determine how to allocate this advantage in terms of exposure time, pixel count, radiation damage, or qualitative types of information acquired.

Another advantage of the system 10 is that use of the system is independent of where and when the post-measurement reconstruction occurs. In fact, with sufficient computing power the post-measurement reconstruction could be well under way even while the data acquisition (i.e., scanning using a plurality of masks) is continuing.

Calibration of the masks may be conducted with one of at least two methods. A first calibration method may be to generate each modulated-scan pattern using the system 10 but with no sample present, and with the STEM system 10 operating in a real-space imaging mode (using lenses placed between the sample and the camera, normally present in any transmission electron microscope, not shown in the Figure). This will directly produce a real-space image of each modulated-intensity mask, each of which is captured with the TEM camera 30. The second method may be to engineer the STEM system 12 to sufficient precision that the modulated-intensity masks may be calculated in advance to adequate precision. One would expect that the results of the second method might be considered trustworthy only after a number of tests using the first method.

In some instances it may be preferred to take suitable measures to compensate for physical drift of the sample 28 during the acquisition of the data set. One standard way to do this is by periodically executing a conventional STEM scan, aligning the resulting image with the previous such image, and shifting the coordinate system of the mathematical model of the mask appropriately. Potentially, advanced mathematical reconstruction techniques using masks may be performed which are designed to be able to detect sample drift. For example, if two masks look identical apart from a spatial translation, then the cross-correlation between measurements made with these two masks provides some information about the drift. With a sufficient number of such translation-pairs in the mix, and the assumption that the drift velocity varies only slowly with time, one could potentially reconstruct the image while simultaneously producing a high-precision estimate of the drift. It will be appreciated that a number of other variations of this drift compensation technique could be potentially implemented.

Successful implementation of the system 10 and method of the present disclosure has the potential to render conventional HAADF-STEM, which is a widely use technique for high-resolution imaging, obsolete for many applications. This is because a STEM-diffraction acquisition has unambiguously more information than a HAADF-STEM acquisition. In fact, it might not be unreasonable to assume that HAADF-STEM is only used because currently available 2D cameras that can capture a diffraction pattern are much too slow to operate at the scan rates allowed by the much faster single-pixel detector used in HAADF-STEM. The compressive STEM system 10 of the present disclosure bypasses this limitation by acquiring the data in a highly optimized way using different masks to create the 2D data set.

The system 10 and method of the present disclosure also has the potential to enable and/or improve the imaging and analysis of radiation-sensitive materials at very high spatial resolution. By making better use of the information imparted to each electron by the sample, the amount of total electron exposure to produce a data set of a given level of resolution and quality could potentially be reduced by a factor of five to ten. Since in modern STEM analysis the resolution limit is very often dictated by the stability of the sample rather than the performance of the instrument, this is a highly valuable advantage. This is particularly so in the area of biological materials and other materials characterized by low atomic numbers and/or bonds that are easily broken and unlikely to self-repair.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A scanning transmission electron microscopy (STEM) system, comprising:
   an electron beam scanning system configured to generate a plurality of electron beam scans over substantially an entire sample, with each said scan varying in electron-illumination intensity over a course of the scan;
   a signal acquisition system for obtaining an image from the scans, the image representing only information from at least one of a select subplurality or linear combination of all pixels comprising the image, and producing a dataset therefrom; and
   a subsystem for mathematically analyzing the dataset to predict actual information that would have been produced by each pixel in a conventional STEM acquisition.

2. The system of claim 1, wherein the subsystem is configured to perform mathematical reconstruction of the dataset using a mathematical method associated with compressive sensing.

3. The system of claim 1, wherein the electron-illumination intensity is varied randomly over the course of each said scan.

4. The system of claim 1, wherein the electron beam scanning system is configured to generate the variation in electron-illumination intensity by varying power applied to an electron gun of the system.

5. The system of claim 1, wherein the electron beam scanning system is configured to generate the variation in electron-illumination intensity by varying at least one of a speed and/or a pattern of each said scan.

6. A scanning transmission electron microscopy (STEM) system, comprising:
   an electron beam scanning system for generating a sequence of electron beam scans directed at a sample, each said electron beam scan having a spatially varying electron-illumination intensity over a course of the scan that creates a mask;
   a signal acquisition subsystem for obtaining an image representing information from at least one of a subplurality or linear combination of all available pixels of the image, and producing a data set from the information; and
   a computer configured to mathematically analyze the data set to predict actual information that would have been obtained from each individual pixel in the image.

7. The STEM system of claim 6, wherein the signal acquisition subsystem comprises a transmission electron microscopy (TEM) camera.

8. The STEM system of claim 6, wherein the signal acquisition subsystem comprises an electron energy loss spectrometer (EELS).

9. The STEM system of claim 6, wherein the signal acquisition subsystem comprises an energy-dispersive x-ray spectrometer (EDX spectrometer).

10. The STEM system of claim 6, wherein the electron beam scanning system is controlled such that a power output applied to an electron gun of the system is varied over the course of each said scan, to thus provide the variation in electron-illumination intensity.

11. The STEM system of claim 6, wherein the electron beam scanning system is controlled so that at least one of a speed or a pattern of each said scan is varied over the course of the scan, to thus provide the variation in electron-illumination intensity.

12. The STEM system of claim 6, wherein the beam modulator subsystem comprises a high speed beam modulator subsystem for varying at least one of a current output or a voltage output to an electron gun, to help produce the variation in electron-illumination intensity.

13. The STEM system of claim 7, wherein the TEM camera obtains a diffraction pattern produced by each said mask.

14. The STEM system of claim 8, wherein the EELS provides a loss spectrum.

15. The STEM system of claim 9, wherein the EDX spectrometer provides an x-ray emission spectrum.

16. The STEM system of claim 6, wherein the electron beam scanning system further comprises a probe-forming lens and a plurality of scanning coils for focusing and controlling movement of each of the electron beam scans.

17. The STEM system of claim 6, wherein the computer is configured to mathematically analyze the data set by performing reconstruction using a mathematical technique associated with compressive sensing.

18. A method for performing scanning transmission electron microscopy (STEM), comprising:
   performing a plurality of electron beam scans over substantially an entire sample, with each said scan varying in electron-illumination intensity over a course of the scan;
   obtaining an image of information from the scans that pertains to only at least one of a select subplurality or a linear combination of all available pixels that comprise the image, and producing a dataset from the information; and mathematically analyzing the dataset to predict actual information that would have been produced by each pixel of the image.

19. The method of claim 18, wherein said varying the electron-illumination intensity over a course of the scan is accomplished by varying a power output of a power supply which powers an electron gun producing the electron beam scans.

20. The method of claim 18, wherein said varying the electron-illumination intensity over a course of the scan comprises varying at least one of a speed or a pattern of each electron beam scan over the course of the scan, to thus provide the variation in electron-illumination intensity.

21. The method of claim 18, wherein the electron-illumination intensity is varied randomly over the course of each said scan.

22. The method of claim 18, wherein said mathematically analyzing the dataset comprises performing reconstruction using a mathematical technique associated with compressive sensing on the dataset.

* * * * *